United States Patent
Yoshida

(10) Patent No.: US 9,543,953 B2
(45) Date of Patent: Jan. 10, 2017

(54) SEMICONDUCTOR DEVICE HAVING FLOATING BODY TYPE TRANSISTOR

(71) Applicant: ELPIDA MEMORY, INC., Tokyo (JP)

(72) Inventor: Soichiro Yoshida, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 327 days.

(21) Appl. No.: 13/967,267

(22) Filed: Aug. 14, 2013

(65) Prior Publication Data

US 2013/0328590 A1    Dec. 12, 2013

Related U.S. Application Data

(62) Division of application No. 13/064,716, filed on Apr. 11, 2011, now Pat. No. 8,537,635.

(30) Foreign Application Priority Data

Apr. 14, 2010 (JP) ................................. 2010-093565

(51) Int. Cl.
| | |
|---|---|
| *H03K 19/0185* | (2006.01) |
| *H03K 19/017* | (2006.01) |
| *G11C 8/00* | (2006.01) |
| *G11C 7/10* | (2006.01) |
| *G11C 11/4091* | (2006.01) |
| *G11C 11/4096* | (2006.01) |
| *H01L 27/108* | (2006.01) |
| *H01L 29/78* | (2006.01) |

(52) U.S. Cl.
CPC ..... *H03K 19/018507* (2013.01); *G11C 7/1048* (2013.01); *G11C 11/4091* (2013.01); *G11C 11/4096* (2013.01); *H03K 19/017* (2013.01); *H01L 27/10802* (2013.01); *H01L 29/7841* (2013.01); *H03K 2217/0018* (2013.01)

(58) Field of Classification Search
CPC .......... H01L 27/10802; H01L 29/7841; G11C 2211/4016; H03K 19/0948; H03K 17/687
See application file for complete search history.

(56) References Cited

U.S. PATENT DOCUMENTS 6,011,411 A * 1/2000 Hokazono ...................... 326/113
6,252,426 B1 * 6/2001 Fulkerson ...................... 326/113
(Continued)

FOREIGN PATENT DOCUMENTS

JP       2003-68877 A    3/2003

*Primary Examiner* — Jany Richardson
(74) *Attorney, Agent, or Firm* — Kunzler Law Group, PC

(57) ABSTRACT

A semiconductor device includes a first circuit node supplied with a first signal changing between first and second logic levels, a second circuit node supplied with a second signal changing between the first and second logic levels, a third circuit node, a first transistor having a gate electrically connected to the first circuit node and a source-drain path electrically connected between the second and third circuit nodes, the first transistor being rendered conductive when the first signal is at the second logic level, a fourth circuit node supplied with a voltage level being close to or the same as the second logic level, and a second transistor having a gate electrically connected to the first circuit node and a source-drain path electrically connected between the third and fourth circuit nodes, the second transistor being rendered conductive when the first signal is at the first logic level.

17 Claims, 11 Drawing Sheets

(56) References Cited

U.S. PATENT DOCUMENTS

| | | |
|---|---|---|
| 6,621,725 B2 | 9/2003 | Ohsawa |
| 7,242,608 B2 | 7/2007 | Ohsawa |
| 7,257,015 B2 | 8/2007 | Ohsawa |
| 7,710,785 B2 | 5/2010 | Ohsawa |
| 7,855,920 B2 | 12/2010 | Ohsawa |
| 2007/0176233 A1* | 8/2007 | Ozawa ................ H01L 27/1203 257/335 |
| 2010/0054016 A1 | 3/2010 | Kajigaya |

* cited by examiner

TRUTH TABLE OF THE LOGIC CIRCUIT 30

| INPUT | | | OUTPUT |
|---|---|---|---|
| S1 | S2 | S3 | OUTi |
| L | L | L | L |
| H | L | L | L |
| L | H | L | L |
| H | H | L | H |
| L | L | H | L |
| H | L | H | L |
| L | H | H | L |
| H | H | H | L |

SEMICONDUCTOR DEVICE HAVING FLOATING BODY TYPE TRANSISTOR

The present application is a Divisional application of U.S. patent application Ser. No. 13/064,716, filed on Apr. 11, 2011, which is based on and claims priority from Japanese patent application No. 2010-093565, filed on Apr. 14, 2010, the entire contents of which is incorporated herein by reference.

BACKGROUND OF THE INVENTION

1. Field of the Invention

The present invention relates to a semiconductor device having a configuration in which a floating body type transistor is used as a path gate.

2. Description of Related Art

Conventionally, a planer type MOS transistor has been generally used as a transistor structure of a semiconductor device. Meanwhile, attention has recently been focused on a floating body type transistor as a transistor structure for achieving higher integration of the semiconductor device, in which a body between source and drain formed over a substrate via an insulating film operates in a floating state. For example, a transistor having a device structure such as SOI (Silicon on Insulator) structure, Fin-FET structure or pillar-shaped structure has been proposed as the floating body type transistor (for example, refer to Patent Reference 1).

[Patent Reference 1] Japanese Patent Application Laid-open No. 2003-68877 (U.S. Pat. No. 6,621,725)

In order to achieve high-speed operation by supplying a signal to a gate of a transistor used in the semiconductor device, a gate capacitance of the transistor is desired to be small as long as possible. However, the gate capacitance of the above-mentioned planer type transistor reaches the bottom when gate and source voltages are approximately equal to each other, and the transistor has C-V characteristics (relation between a gate-source voltage and the gate capacitance) with which the gate capacitance is increased even if the gate voltage changes upward or downward from this point. In other words, if the gate voltage is higher than the source voltage, a capacitance between a gate wiring and an inversion layer becomes dominant as viewed from the gate wiring, and if the gate voltage is lower than the source voltage, a capacitance between the gate wiring and a substrate becomes dominant as viewed from the gate wiring, in both of which the gate capacitance increases. In these cases, reducing the gate capacitance by controlling the gate voltage based on a relation with the source voltage is not so effective, which poses a problem that an effective control is difficult since the position of the above bottom fluctuates due to variations in manufacturing process, operation voltages and operating temperature. For example, when using a transistor as a path gate inserted in a signal path in the semiconductor device, there is a problem that proper control cannot be achieved in terms of reducing the gate capacitance and thus high-speed operation is hindered. There is the same problem when using the transistor in a logic circuit that requires the high-speed operation. Further, even when employing the above floating body type transistor in the semiconductor device, it is difficult to achieve the reduction in gate capacitance by the above-mentioned conventional method of the gate voltage.

SUMMARY

One of aspects of the invention is a semiconductor device comprising: a transistor having a gate, a source coupled to one of first and second nodes, a drain coupled to the other of the first and second nodes, and a body between the source and drain, the body being brought into an electrically floating state; a first circuit supplying the gate of the transistor with a first signal changing between a first logic level that holds the transistor in a non-conductive state and a second logic level that directs the transistor into a conductive state; and a second circuit supplying, when the transistor is not utilized, a first voltage level near the second logic level to the first circuit node and a second voltage level near the second logic level to the second circuit node.

According to the semiconductor device of the invention, the floating body type transistor is arranged as a path gate of a signal path, for example, and when the first signal supplied to the gate is shifted from the first logic level to the second logic level in a circuit state where the transistor is not utilized, a small gate capacitance of the transistor can be maintained as viewed from a gate wiring by appropriately controlling the relation of voltages of the logic levels and the first and second circuit nodes in the operation. Thus, a waveform of the first signal is not rounded so as to enable high-speed control, and it is possible to achieve high-speed operation in a circuit having the floating body type transistor as the path gate and a reduction in consumption current.

The present invention can be applied to various circuits. For example, the present invention can be applied to a configuration including bit lines, sense amplifiers connected to the bit lines, and a first input/output line connected to the sense amplifiers. In this case, by controlling the voltages in the above manner using the floating body type transistor that is inserted between an output node of each sense amplifier and the first input/output line, it is possible to achieve an increase in speed of a read operation and a reduction in consumption current.

According to the present invention, since the relation of voltages of the gate and the source/drain is appropriately controlled using the floating body type transistor, the gate capacitance as viewed from the gate wiring can be kept small, and it is possible to achieve higher-speed circuit operation and a reduction in consumption current. Particularly, in a configuration in which the first signal selectively controls a large number of transistors, influence of the gate capacitance of a non-selected transistor becomes larger, and therefore a large effect can be obtained by employing the voltage control using the floating body type transistor.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
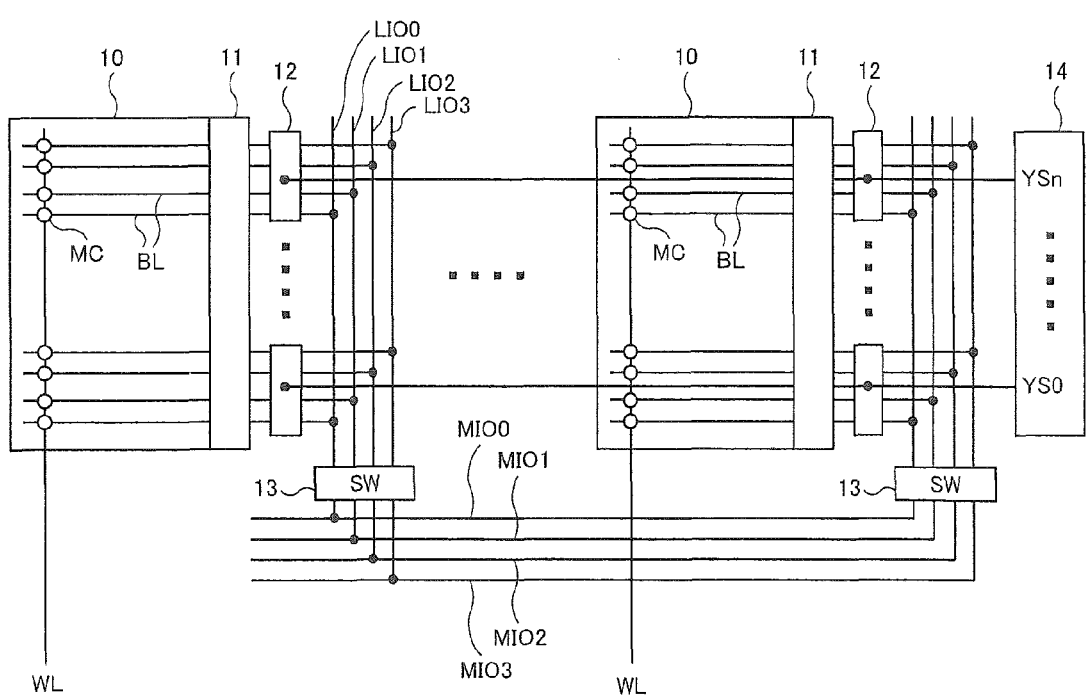
FIG. 1 is a block diagram showing an outline configuration of a memory cell array and column circuits in a DRAM of a first embodiment.

A first embodiment describes an example in which the present invention is applied to column circuits of a DRAM (Dynamic Random Access Memory) as the semiconductor device. FIG. 1 is a block diagram showing an outline configuration of a memory cell array and column circuits in the DRAM of the first embodiment. In the block diagram of FIG. 1, a memory cell array 10 and a sense amplifier array 11 attached to the memory cell array 10 form a unit area, and a plurality of unit areas are aligned in a bit line direction. In the memory cell array 10, a plurality of word lines WL and a plurality of bit lines BL orthogonal to the word lines WL are arranged, and a plurality of memory cells MC are formed at intersections thereof. Each bit line BL is connected to a sense amplifier of the sense amplifier array 11. In the memory cell array 10, a signal is read out from the memory cell MC selected by the word line WL to the bit line BL, and a corresponding sense amplifier senses and amplifies the signal of the bit line BL and latches it.

At one end of a row of the plurality of unit areas, there is arranged a column decoder 14 (the first circuit of the invention) that selectively activates a plurality of column selection signals YS (the first signal of the invention) in response to a column address. In the example of FIG. 1, each of n+1 column selection signal YS (YS0 to YSn) is supplied to each of n+1 column selection circuits 12 adjacent to each sense amplifier array 11, and connections between four sense amplifiers of the sense amplifier array 11 and four local input/output lines LIO (LIO0, LIO1, LIO2 and LIO3) are controlled in response to the column selection signals YS. Since each column selection signal YS is supplied to a plurality of sense amplifier arrays 11, not only sense amplifiers of a selected sense amplifier array 11, but also sense amplifiers of non-selected sense amplifier arrays 11 are connected to the local input/output lines LIO (LIO0 to LIO3) at the same time.

Each switch circuit 13 controls connections between the four local input/output lines LIO (LIO0 to LIO3) and the four main input/output lines MIO (MIO0 to MIO3). As shown in FIG. 1, the local input/output lines LIO in the plurality of unit areas are connected to common main input/output lines MIO through a plurality of switch circuits 13. The signal transmitted through the main input/output lines MIO is outputted to outside via a read amplifier (not shown).

Figure 2:
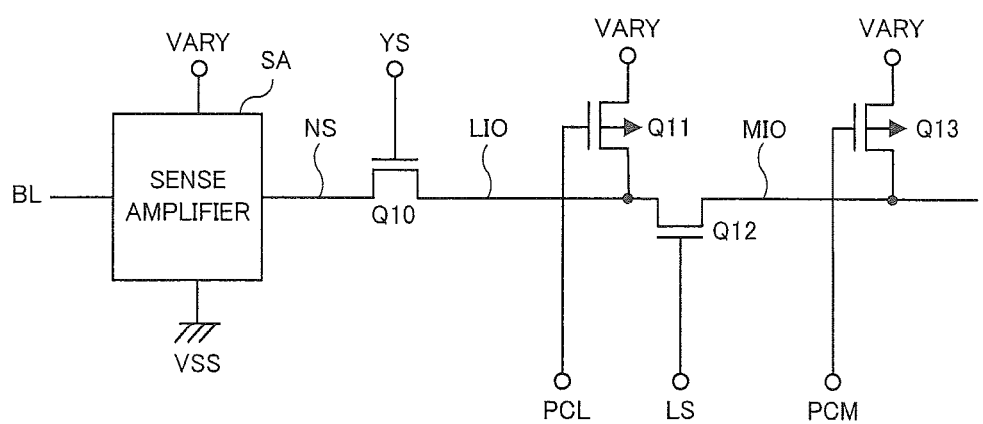
FIG. 2 is a diagram showing a specific circuit configuration example of a part in the column circuits of FIG. 1.

Next, a specific circuit configuration of a part in the column circuits of FIG. 1 will be described with reference to FIGS. 2 and 3. FIG. 2 shows one sense amplifier SA of the sense amplifier array 11 and a circuit portion associated with the local input/output line LIO and the main input/output line MIO connected to the sense amplifier in the block diagram shown in FIG. 1. Further, FIG. 3 shows a specific circuit configuration example of the sense amplifier SA of FIG. 2.

Figure 3:
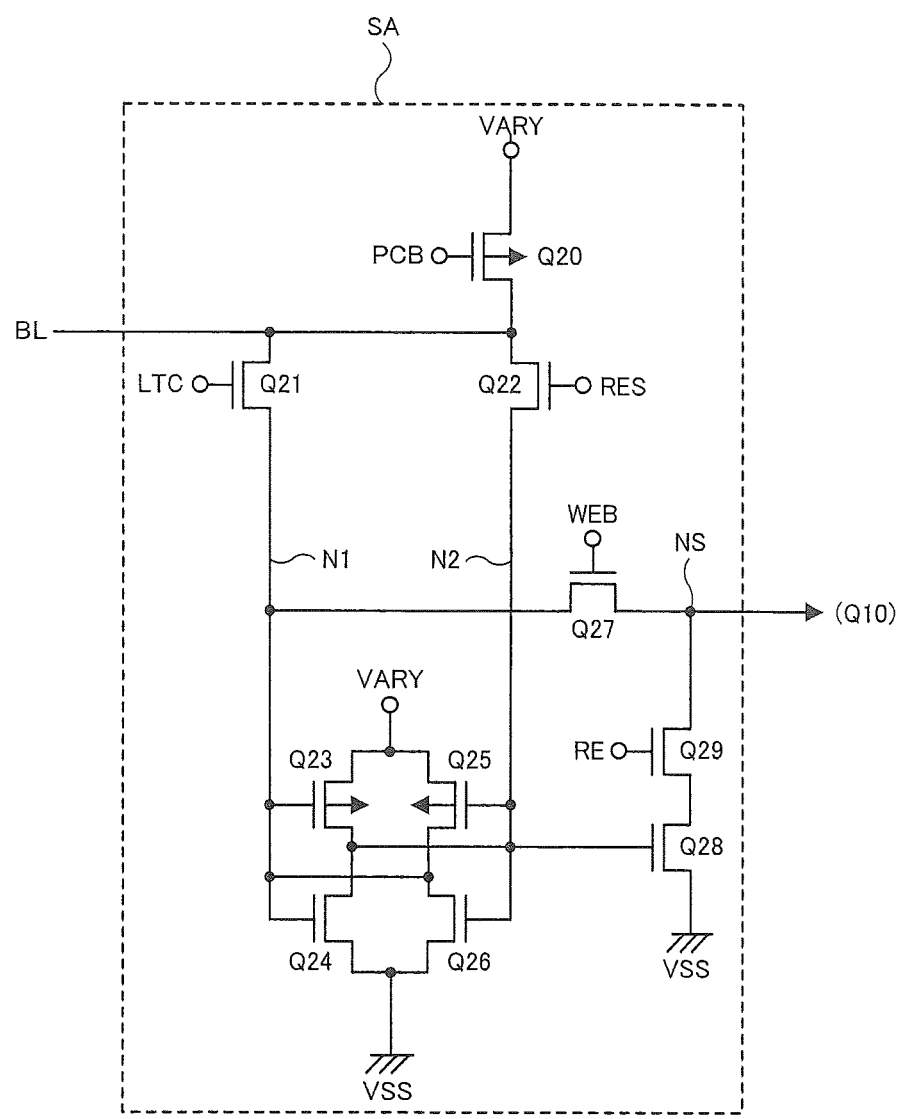
FIG. 3 is a diagram showing a specific circuit configuration example of a sense amplifier of FIG. 2.

The sense amplifier SA has a single-ended circuit configuration including three P-channel type transistors Q20, Q23 and Q25 and seven N-channel type transistors Q21, Q22, Q24, Q26, Q27, Q28 and Q29, as shown in FIG. 3. The transistor Q20 precharges the bit line BL to a power supply voltage VARY in response to a control signal PCB applied to its gate. The transistor Q21 controls a connection between the bit line BL and a node N1 in response to a control signal LTC applied to its gate. The transistor Q22 controls a connection between the bit line BL and a node N2 in response to a control signal RES applied to its gate.

The transistors Q23, Q24, Q25 and Q26 form a latch circuit, which determines a signal voltage of the bit line BL in a binary value and latches it. A pair of transistors Q23 and Q24 forms an inverter whose input is the node N1, a pair of transistors Q25 and Q26 forms an inverter whose input is the node N2, and these two inverters are cross-coupled to each other at their inputs and outputs. The transistor Q27 for a write operation is connected between the node N1 and an output node NS, and a control signal WEB is applied to its gate. Two transistors Q28 and Q29 for a read operation are connected in series between the output node NS and a ground potential VSS. The node N2 is connected to the gate of the transistor Q28, and a control signal RE is applied to the gate of the transistor Q29.

When the sense amplifier SA shown in FIG. 3 is not selected, the power supply voltage VARY is supplied to the output node NS by controlling the control signals PCB, RES and RE to be "low" respectively and controlling the control signals WEB and LTC to be "high" respectively. That is, the power supply voltage VARY is supplied to the bit line BL by the transistor Q20 and thereafter the power supply voltage VARY is also supplied to the output node NS through the transistors Q21 and Q27 from the bit line BL.

Returning to FIG. 2, an N-channel type transistor Q10 as the floating body type transistor of the invention is a unit switch included in the column selection circuit 12 of FIG. 1 and is connected between the output node NS (the first circuit node the invention) at the output side of the sense amplifier SA and the local input/output line LIO (the second circuit node of the invention). The column selection signal YS is applied to the gate of the transistor Q10, which becomes conductive when the column selection signal YS is "high" and becomes non-conductive when the column selection signal YS is "low". For example, the high level (the second logic level of the invention) of the column selection signal is set to a power supply voltage VDD, and the low level (the first logic level of the invention) thereof is set to the ground potential VSS. In the first embodiment, the floating body type MOS transistor is employed as the transistor Q10 that is a column selection switch, thereby improving operation characteristics based on a relation between voltages of the transistor Q10 and the column selection signal YS, which will be described in detail later.

A P-channel type transistor Q11 functions as a precharge circuit precharging the local input/output line LIO to the power supply voltage VARY in response to a control signal PCL applied to its gate. An N-channel type transistor Q12 is a unit switch included in the switch circuit 13 of FIG. 1, and is connected between the local input/output line LIO and the main input/output line MIO. Switching of the transistor Q12 is controlled in response to a control signal LS applied to its gate. A P-channel type transistor Q13 precharges the main input/output line MIO to the power supply voltage VARY in response to a control signal PCM applied to its gate. In addition, the sense amplifier SA and the transistor Q11 integrally function as the second circuit of the invention.

In FIG. 2, when the column selection signal YS is activated to "high", an output signal of the sense amplifier SA is coupled to the local input/output line LIO via the transistor Q10, and further when the control signal LS is activated, the local input/output line LIO is connected to the main input/output line MIO via the transistor Q12. In a precharge operation, both the control signals PCL and PCM are changed to "low" so that both the local input/output line LIO and the main input/output line MIO go into a state of being precharged to the power supply voltage VARY.

In the example of FIG. 2, although the power supply voltage VARY is supplied to the sense amplifier SA and the transistors Q11 and Q13 for precharging, respectively, a power supply voltage level can be properly changed. However, in a non-selected sense amplifier SA corresponding to the activated column selection signal YS, it is preferable to drive the sense amplifier SA and the transistor Q11 with power supply voltages having the same level for the purpose of preventing a current from flowing between a non-selected bit line BL and a non-selected local input/output line LIO.

Although the floating body type MOS transistor is employed as the transistor Q10 in FIG. 2, other transistors Q11 to Q13 and Q20 to Q29 are not restricted, for which the floating body type MOS transistor or other kinds of transistors may be used.

Figure 4:
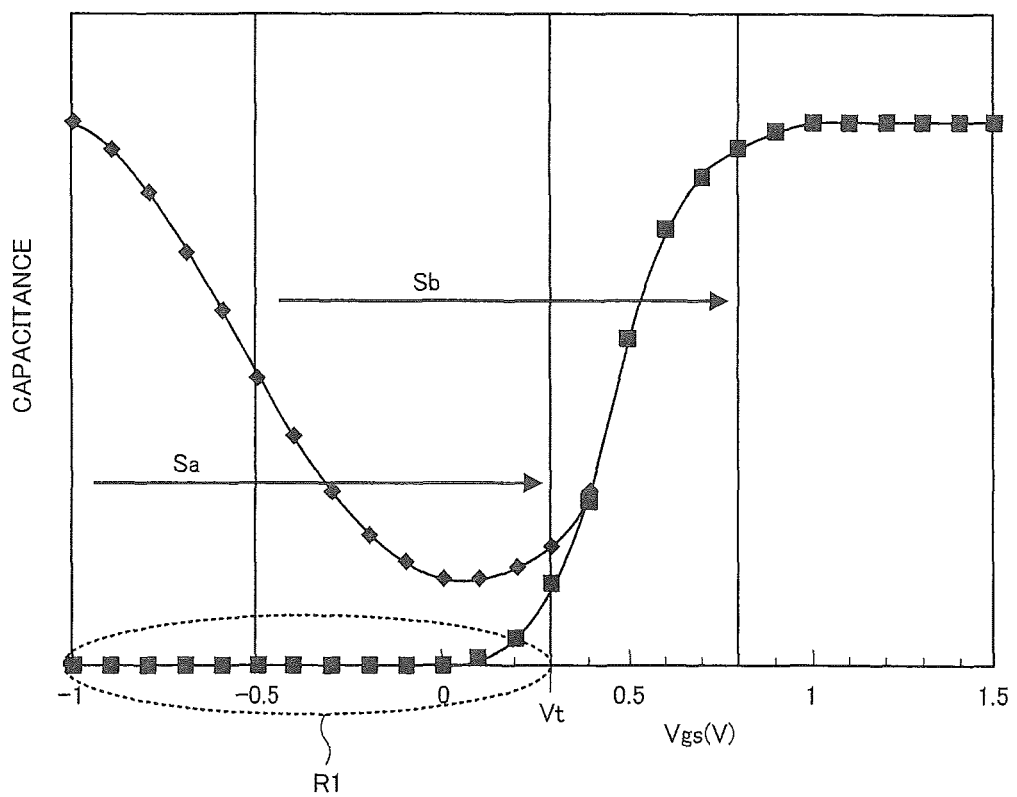
FIG. 4 is a diagram explaining a C-V characteristic in using a floating body type MOS transistor in the first embodiment.

Next, C-V characteristics (relation between a gate-source voltage and a gate capacitance) in using the floating body type MOS transistor in the first embodiment will be described with reference to FIG. 4. FIG. 4 is a graph showing the C-V characteristics of the floating body type transistor Q10 of FIG. 2. In FIG. 4, another C-V characteristic obtained by replacing the transistor Q10 with a conventional planer type MOS transistor is shown for comparison, which is overlapped with a C-V characteristic of the floating body type transistor Q10. In addition, conditions of a source voltage Vs, a drain voltage Vd, the power supply voltages VDD, VARY, and a bit line voltage VBLP are Vs=Vd=VARY (=1.0V) for the floating body type MOS transistor, and are Vs=Vd=VBLP (=0.5V) for the planer type MOS transistor, assuming VDD=1.3V for both cases.

In FIG. 4, a threshold voltage Vt (=0.3V) is at the center of a gate-source voltage Vgs (hereinafter, referred to simply as "Vgs") along a horizontal axis. As shown in FIG. 4, in a region where Vgs exceeds the threshold voltage Vt, respective gate capacitances of the floating body type MOS transistor and the planer type MOS transistor are approximately equal to each other, and as Vgs increases, the gate capacitances rapidly increase until reaching a predetermined level. This is because a capacitance between the gate and an inversion layer becomes dominant in each of the gate capacitances of the floating body type MOS transistor and the planer type MOS transistor in the region where Vgs exceeds the threshold voltage Vt.

In contrast, in a region where Vgs is lower than the threshold voltage Vt, the respective gate capacitances of the floating body type MOS transistor and the planer type MOS transistor change differently from each other. That is, as shown in FIG. 4, in a region R1 where Vgs is lower than the threshold voltage Vt in the floating body type MOS transistor, a capacitance between the gate and a substrate is invisible since a body between the source and drain is in a floating state, so that the gate capacitance is approximately 0. Meanwhile, in the planer type MOS transistor, the gate capacitance decreases in a center region where Vgs is near the threshold voltage Vt, and the gate capacitance increases in a region where Vgs decreases relatively to the center region since influence of the capacitance between the gate and the substrate becomes larger.

Considering a transition of Vgs corresponding to the control of the column selection signal YS applied to a gate electrode when the transistor Q10 is changed from a non-conductive state into a conductive state, FIG. 4 shows a transition Sa for the floating body type MOS transistor and a transition Sb for the planer type MOS transistor. That is, when the column selection signal YS is activated from the ground potential VSS to the power supply voltage VDD (=1.3V), Vgs changes from −1V to +0.3V in the transition Sa since Vs=Vd=VARY (=1V) is maintained, and Vgs changes from −0.5V to +0.8V in the transition Sb since Vs=Vd=VBLP (=0.5V) is maintained. The gate capacitance of the floating body type MOS transistor is maintained at 0 within a range of the transition Sa, and the gate capacitance of the planer type MOS transistor largely changes within a range of the transition Sb.

According to the C-V characteristics of FIG. 4, in order to direct the transistor Q10 into the conductive state, the column selection signal YS is activated in the circuit configuration of FIG. 2, and when the column selection signal YS changes from "low" to "high", the gate capacitance is maintained at approximately 0. Thus, the gate capacitance as viewed from a line of the column selection signal YS decreases at this point, there is an effect of obtaining a high-speed waveform being not rounded, and consumption current in a column selection operation can be reduced. As described above, one line of the column selection signal YS is connected to gates of a large number of transistors Q10, and therefore if the column selection operation is performed in a state where the power supply voltage VARY is supplied to sources/drains of the transistors Q10 corresponding to non-selected sense amplifiers SA, the effect of reducing the consumption current correspondingly increases.

Additionally, the first embodiment has described a case of using an NMOS type transistor as the floating body type transistor Q10. However, the invention can be also applied to a case of using a PMOS type transistor. In this case, a relative voltage relation of the gate and the source/drain of the transistor may be inverted relative to the case of the first embodiment.

Second Embodiment

Figure 5:
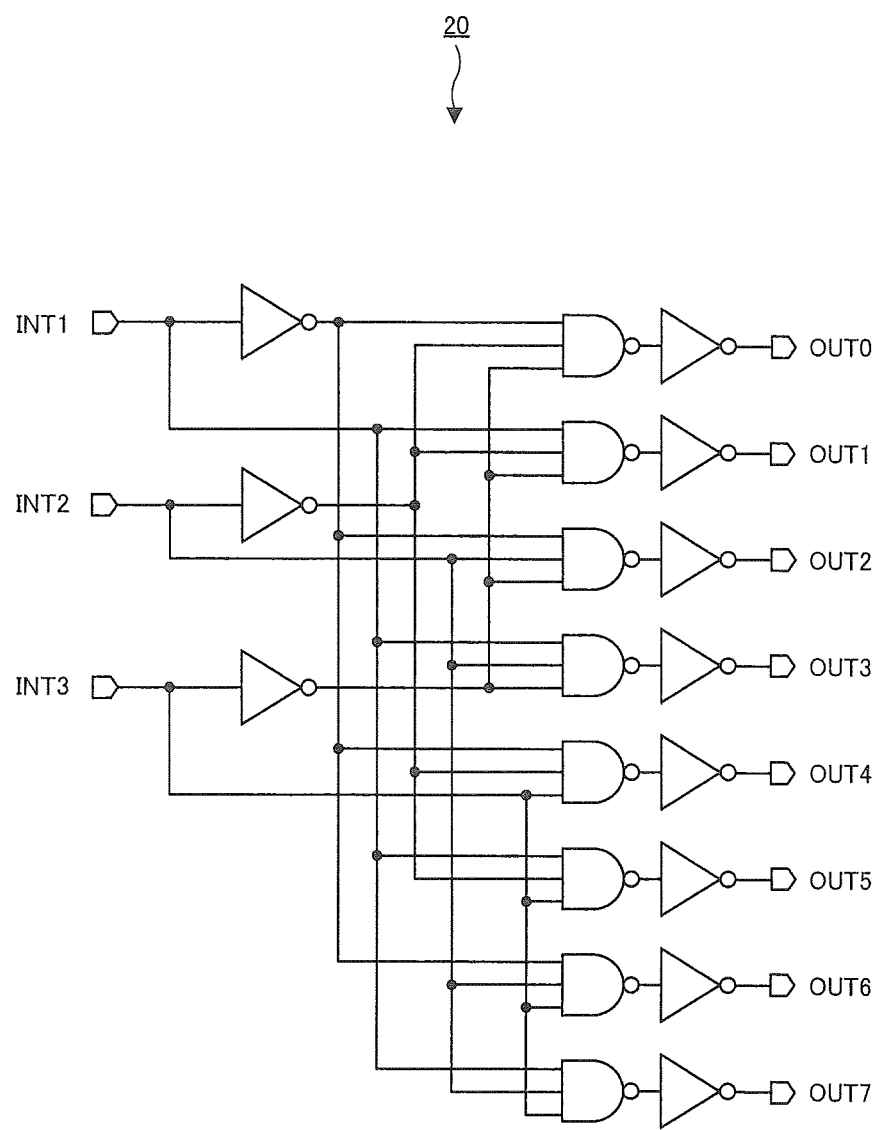
FIG. 5 is a diagram showing a configuration example of a general 3-to-8 selector.

A second embodiment describes an example in which the present invention is applied to a general logic circuit in the semiconductor device. Hereinafter, as one example of the logic circuit, a 3-to-8 selector selecting one of eight output signals based on three input signals will be described with reference to FIGS. 5 to 8. FIG. 5 shows a configuration example of a general 3-to-8 selector 20 for comparison, and FIG. 6 shows a configuration example of a 3-to-8 selector 21 to which the invention is applied.

First, the 3-to-8 selector 20 of FIG. 5 selects one of eight output signals OUT0 to OUT7 in accordance with a logical combination of three input signals INT1, INT2 and INT3 so that the selected signal changes to a high level, and the 3-to-8 selector 20 includes three inverters on an input-side, eight 3-input NAND gates, and eight inverters on an output-side. Each of the 3-input NAND gates outputs a low level when all input three signals are at a high level, and the output thereof becomes an output signal OUTi (i=0 to 7) of the high level via each inverter.

Figure 6:
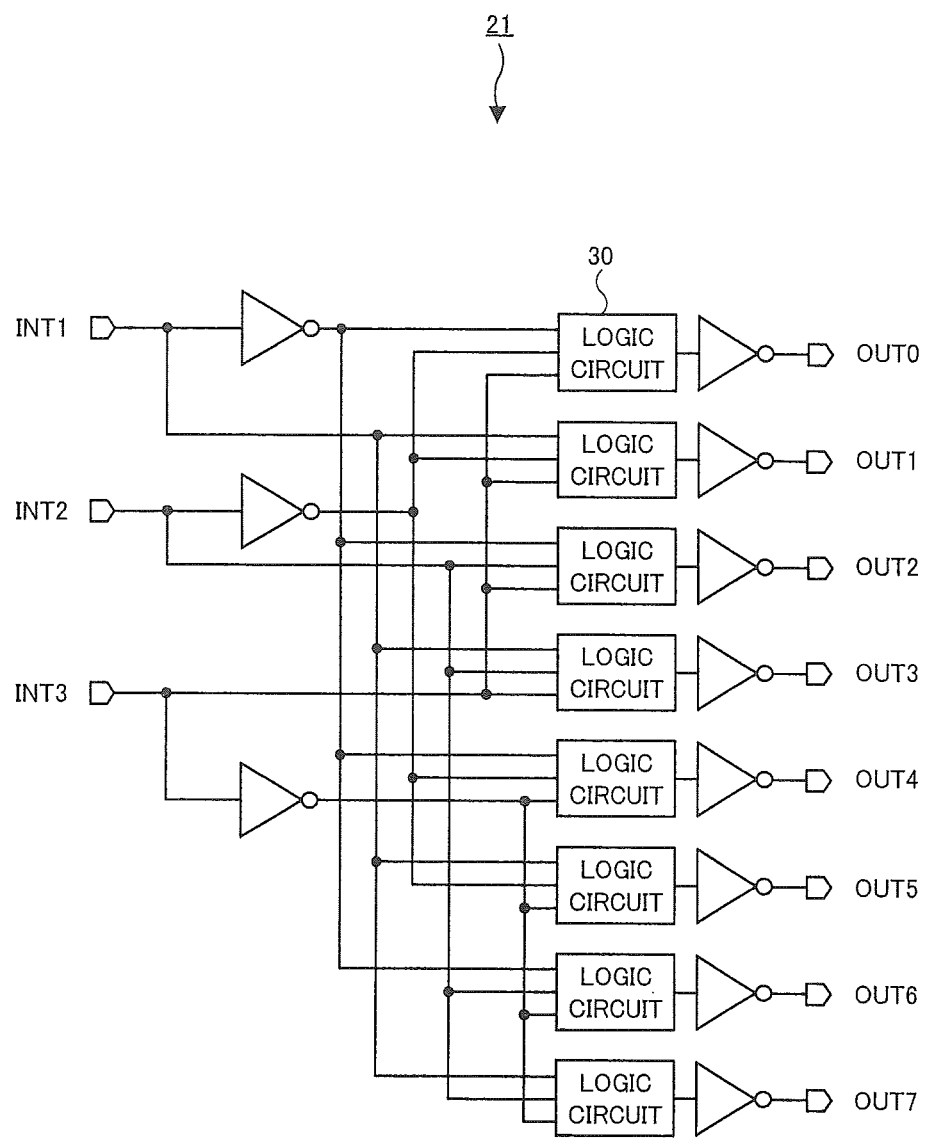
FIG. 6 is a diagram showing a configuration example of a 3-to-8 selector to which the invention is applied.

Meanwhile, the 3-to-8 selector 21 of FIG. 6 is configured by replacing the eight 3-input NAND gates in the circuit configuration of FIG. 5 with eight logic circuits 30, and each of the logic circuits 30 includes the floating body type MOS transistor having the C-V characteristics of FIG. 4. In addition, a basic operation of the 3-to-8 selector 21 of FIG. 6 is common to that of the 3-to-8 selector 20 of FIG. 5.

Figures 7A, 7B:
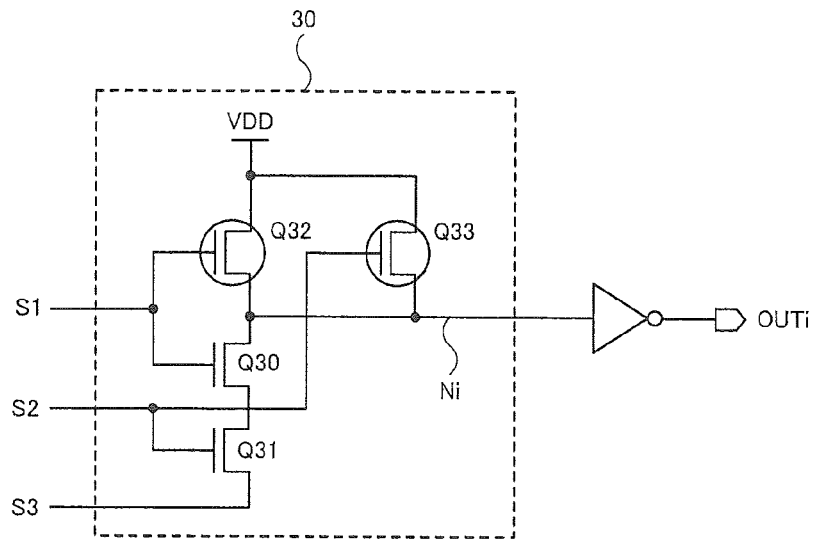
FIGS. 7A and 7B are diagrams explaining a circuit configuration example of each logic circuit included in the circuit configuration of FIG. 6.

FIG. 7A shows a circuit configuration example of each logic circuit 30 included in the circuit configuration of FIG. 6. The logic circuit 30 includes N-channel type transistors Q30, Q31 and P-channel type transistors Q32, Q33, and outputs a signal corresponding to a logical combination of three input signals S1, S2 and S3 to a node Ni. In the logic circuit 30, the floating body type MOS transistor is used for each of the transistors Q30 and Q31. The signals S1, S2 and S3 change in accordance with a logical state of the input signals INT1, INT2 and INT3 of FIG. 6. As shown in a truth table of FIG. 7B, in the configuration example of the logic circuit 30 of FIG. 7A, a selected state appears when the signals S1 and S2 are "high" (the power supply voltage VDD) and the signal S3 is "low" (the ground potential VSS), and thus the node Ni changes to "low" so that the output signal OUTi becomes "high" via the inverter. In other conditions, the output signal OUTi becomes "low".

In FIG. 7A, the signal S1 is inputted to gates of a pair of transistors Q30 and Q32 that form an inverter, and an output side of this inverter is connected to the node Ni. The signal S2 is inputted to the gate of the transistor Q33 connected between the power supply voltage VDD and the node Ni. The signal S2 is inputted to the gate of the transistor Q31 connected in series with the transistor Q30, and the signal S3 is inputted to the source of the transistor Q31. When the signals S1 and S2 are "high" and the signal S3 is "low", the transistors Q30 and Q31 become conductive so as to decrease the potential of the node Ni to "low" (selected state). Meanwhile, when the signal S3 is "high", the node Ni remains "high" (non-selected state) since no current flows through the transistors Q30 and Q31.

Figure 8:
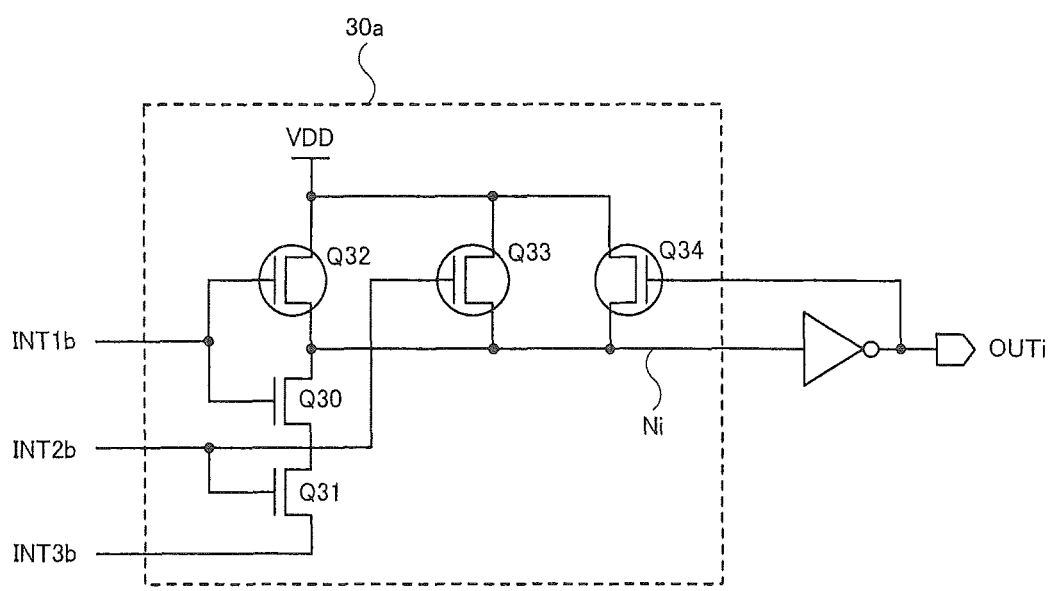
FIG. 8 is a diagram showing a modification of the logic circuit of FIG. 7A.

Here, in an operation of the non-selected state where the signal S3 is "high", the power supply voltage VDD is supplied to sources of the floating body type transistors Q30 and Q31. Therefore, when the signals S1 and S2 change from "low" to "high", or when the signals S1 and S2 change from "high" to "low", the transistors Q30 and Q31 transit in the region where the C-V characteristics of FIG. 4 is low (region of Vgs<0). Accordingly, gate capacitances of the transistors Q30 and Q31 as viewed from lines of the signals S1 and S2 maintain a value near 0, and therefore it is possible to achieve high-speed operation waveforms and a reduction in consumption current FIG. 8 shows a circuit configuration example of a logic circuit 30a that is a modification of the logic circuit 30 of FIG. 7A. Most parts in the logic circuit 30a of FIG. 8 are common to those in the logic circuit 30 of FIG. 7. However, a difference exists in that a P-channel type transistor Q34 is provided in addition to the above transistors Q30 to Q33. The transistor Q34 is connected between the power supply voltage VDD and the node Ni, and the output signal OUTi is applied to its gate. Thereby, when the output signal OUTi changes to "low", the transistor Q34 turns on so as to supply the power supply voltage VDD to the node Ni, and therefore it is possible to prevent the node Ni from being in a floating state.

[Device Structure]

Figure 9:
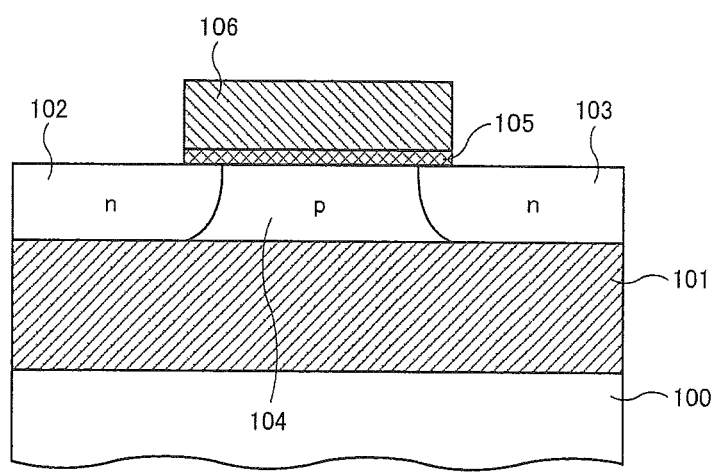
FIG. 9 is diagram showing a structural example of a MOS transistor using SOI structure.

In the following, device structures of the floating body type transistor of the invention will be described with reference to FIGS. 9 to 11. FIG. 9 shows a structural example of a MOS transistor using SOI (Silicon on Insulator) structure. In the structural example of FIG. 9, an insulating film 101 is formed on a silicon substrate 100, and, for example, N type source-drain diffusion layers 102 and 103 are formed on both sides on the insulating film 101. For example, a P-type body region 104 is formed in a region between the source-drain diffusion layers 102 and 103. A gate electrode 106 is formed over the body region 104 via a gate insulating film 105. As described above, the body region 104 is electrically separated from the surrounding parts so as to be in the floating state.

Figure 10:
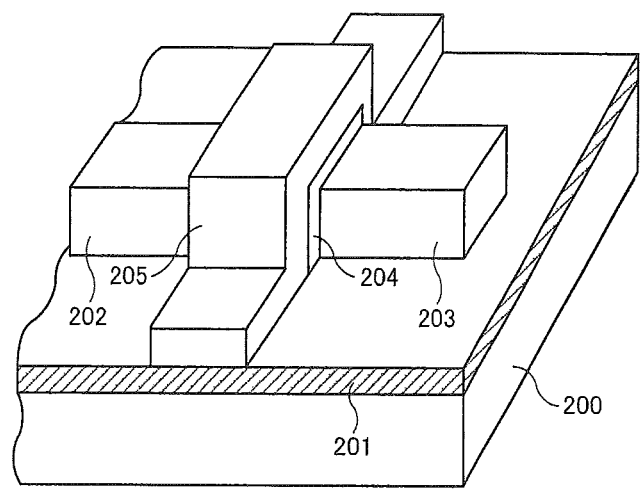
FIG. 10 is a diagram showing a structural example of a MOS transistor using Fin-FET structure.

FIG. 10 is a perspective view showing a structural example of a MOS transistor using Fin-FET structure. In the structural example of FIG. 10, an insulating film 201 is formed on a silicon substrate 200, and a so-called Fin between source/drain electrodes 202 and 203 on the insulating film 201 functions as a body. A gate electrode 205 is formed over the Fin via a gate insulating film 204. The body under the gate electrode 205 is electrically separated from the surrounding parts so as to be in the floating state.

Figure 11:
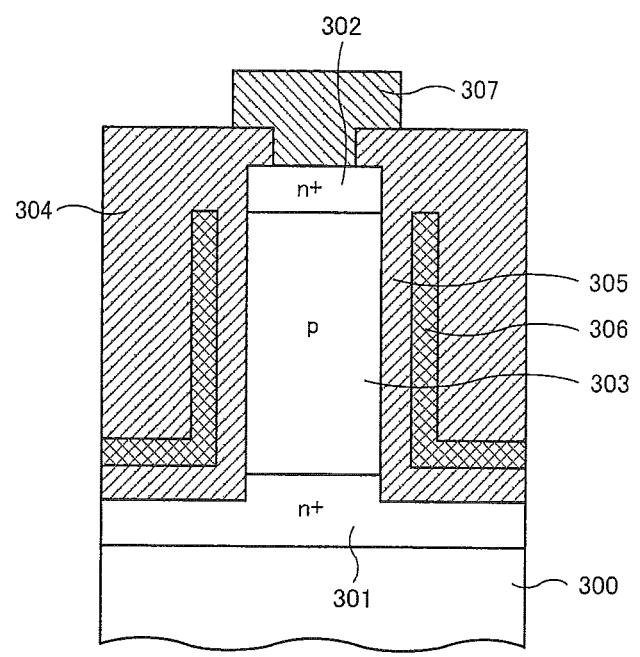
FIG. 11 is a diagram showing a structural example of a MOS transistor using pillar-shaped structure.

FIG. 11 shows a structural example of a MOS transistor using pillar-shaped structure. In the structural example of FIG. 11, for example, N+ type source/drain regions 301 and 302 are formed in lower and upper layers of a pillar-shaped region over a silicon substrate 300, and a body 303 as, for example, a P-type region is formed between the source/drain regions 301 and 302. An interlayer insulating film 304 surrounds the pillar-shaped region, and a gate electrode 306 surrounding the body 303 via a gate insulating film 305 is formed inside the interlayer insulating film 304. A wiring layer 307 used as, for example, a bit line is formed over the source/drain region 302. Also, in this structural example, the body 303 is electrically separated from the surrounding parts so as to be in the floating state.

In the foregoing, the preferred embodiments of the present invention have been described. However the present invention is not limited to the above embodiments and can variously be modified without departing the essentials of the present invention. That is, the present invention covers the various modifications which those skilled in the art can carry out in accordance with all disclosures including claims and technical ideas.

The present invention can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like, in addition to the DRAM. Further, the present invention can be applied to various device structures such as SOC (System on Chip), MCP (Multi Chip Package) and POP (Package on Package) and the like. Furthermore, various transistors can be used in the embodiments. For example, a field-effect transistor (FET) can be used in the embodiments, and various types of FETs such as MIS (Metal-Insulator Semiconductor), TFT (Thin Film Transistor), and the like can be used in the embodiments.

The invention claimed is:

1. A semiconductor device comprising:
   a first circuit node supplied with a first signal changing between first and second logic levels;
   a second circuit node supplied with a second signal changing between the first and second logic levels;
   a third circuit node;
   a first transistor having a gate electrically connected to the first circuit node and a source-drain path electrically connected between the second and third circuit nodes, the first transistor being rendered conductive when the first signal is at the second logic level;
   a fourth circuit node supplied with a voltage level being close to or the same as the second logic level; and
   a second transistor having a gate electrically connected to the first circuit node and a source-drain path electrically connected between the third and fourth circuit nodes, the second transistor being rendered conductive when the first signal is at the first logic level, the first transistor being configured as a floating body type in which a body between a source and a drain is in an electrically floating state;
   a fifth circuit node supplied with a third signal changing between the first and second logic levels;
   a third transistor having a gate electrically connected to the fifth circuit node and a source-drain path electrically connected in series with the first transistor between the second and third circuit nodes, the third transistor rendered conductive when the third signal is at the second logic level; and
   a fourth transistor having a gate electrically connected to the fifth circuit node and a source-drain path electrically connected in parallel with the second transistor between the third and fourth circuit nodes, the third transistor rendered conductive when the third signal is at the first logic level, the third transistor being configured as the floating body type.

2. The semiconductor device as claimed in claim 1, wherein the second transistor is configured as the floating body type.

3. The semiconductor device as claimed in claim 1, wherein the fourth transistor is configured as the floating body type.

4. The semiconductor device as claimed in claim 1, wherein the third circuit node is supplied with the second logic level when the second signal is at the second logic level.

5. The semiconductor device as claimed in claim 4, wherein the third circuit node is supplied with one of the first and second logic levels when the second signal is at the first logic level.

6. The semiconductor device as claimed in claim 1, further comprising:
   an inverter circuit including input and output nodes, outputting a logic level of the output node opposite to a logic level of the input node, and the input node being coupled to the third circuit node; and
   a fifth transistor including first and second electrodes and a gate electrode, the gate electrode of the fifth transistor being coupled to the output node of the inverter circuit, the first electrode of the fifth transistor being coupled to the fourth circuit node, and the second electrode of the fifth transistor being coupled to the third circuit node.

7. The semiconductor device as claimed in claim 1, wherein the third circuit node is supplied with the second logic level when the second signal is at the second logic level.

8. The semiconductor device as claimed in claim 7, wherein the third circuit node is supplied with one of the first and second logic levels when the second signal is at the first logic level.

9. The semiconductor device as claimed in claim 1, further comprising:
   an inverter circuit including input and output nodes, outputting a logic level of the output node opposite to a logic level of the input node, and the input node being coupled to the third circuit node; and
   a fifth transistor including first and second electrodes and a gate electrode, the gate electrode of the fifth transistor being coupled to the output node of the inverter circuit, the first electrode of the fifth transistor being coupled to the fourth circuit node, and the second electrode of the fifth transistor being coupled to the third circuit node.

10. A semiconductor device comprising first and second logic circuits, each of the first and second logic circuits comprising:
    a first transistor including first and second electrodes, a gate electrode, and a body electrode between the first and second electrodes thereof, the first transistor being of a first conductivity type;
    a second transistor including first and second electrodes, a gate electrode, and a body electrode between the first and second electrodes thereof, the second transistor being of a second conductivity type different from the first conductivity type;
    a third transistor including first and second electrodes, a gate electrode, and a body electrode between the first and second electrodes thereof, the third transistor being of the first conductivity type, and the third transistor being coupled in series with the first transistor;
    a fourth transistor including first and second electrodes, a gate electrode, and a body electrode between the first and second electrodes thereof, the fourth transistor being of the second conductivity type, and the fourth transistor being coupled in parallel with the second transistor;
    a first circuit node coupled to each of the gate electrode of the first transistor and the gate electrode of the second transistor, and being supplied with a first signal changing between the first and second logic levels;
    a second circuit node coupled to the first electrode of the first transistor, and being supplied with a second signal changing between first and second logic levels;
    a third circuit node coupled to each of the second electrode of the third transistor, the second electrode of the second transistor, and the second electrode of the fourth transistor;
    a fourth circuit node coupled to each of the first electrode of the second transistor and the first electrode of the fourth transistor, and being supplied with the second level; and
    a fifth circuit node coupled to each of the gate electrode of the third transistor and the gate electrode of the fourth transistor, and being supplied with a third signal changing between the first and second logic levels;
    each of the first and third transistors being configured as a floating body type in which a body electrode is in an electrically floating state.

11. The semiconductor device as claimed in claim 10, wherein a logic level of the first signal of the first logic circuit is opposite to a logic level of the first signal of the second logic circuit.

12. The semiconductor device as claimed in claim 10, wherein a logic level of the second signal of the first logic circuit is opposite to a logic level of the second signal of the second logic circuit.

13. The semiconductor device as claimed in claim 10, wherein a logic level of the third signal of the first logic circuit is opposite to a logic level of the third signal of the second logic circuit.

14. The semiconductor device as claimed in claim 10, wherein the third circuit node of the first logic circuit is supplied with the second logic level when the second signal of the first logic circuit is at the second logic level, and the third circuit node of the second logic circuit is supplied with the second logic level when the second signal of the second logic circuit is at the second logic level.

15. The semiconductor device as claimed in claim 14, wherein the third circuit node of the first logic circuit is supplied with one of the first and second logic levels when the second signal of the first logic circuit is at the first logic level, and the third circuit node of the second logic circuit is supplied with one of the first and second logic levels when the second signal of the second logic circuit is at the first logic level.

16. The semiconductor device as claimed in claim 10, wherein each of the first and second logic circuits further comprises:
    an inverter circuit including input and output nodes, outputting a logic level of the output node opposite to a logic level of the input node, and the input node being coupled to the third circuit node; and
    a fifth transistor including first and second electrodes and a gate electrode, the gate electrode of the fifth transistor being coupled to the output node of the inverter circuit, the first electrode of the fifth transistor being coupled to the fourth circuit node, and the second electrode of the fifth transistor being coupled to the third circuit node.

17. The semiconductor device as claimed in claim 10, wherein each of the second and fourth transistors of the first logic circuit is configured as the floating body type, and each of the second and fourth transistors of the second logic circuit is configured as the floating body type.

* * * * *